(12) United States Patent
Yoo et al.

(10) Patent No.: US 11,043,617 B2
(45) Date of Patent: Jun. 22, 2021

(54) LED DISPLAY DEVICE

(71) Applicant: LUMENS CO., LTD., Yongin-si (KR)

(72) Inventors: Tae Kyung Yoo, Yongin-si (KR); Seong Bok Yoon, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/496,622

(22) PCT Filed: Jan. 5, 2018

(86) PCT No.: PCT/KR2018/000230
§ 371 (c)(1),
(2) Date: Sep. 23, 2019

(87) PCT Pub. No.: WO2018/182146
PCT Pub. Date: Oct. 4, 2018

(65) Prior Publication Data
US 2020/0020833 A1    Jan. 16, 2020

(30) Foreign Application Priority Data

Mar. 27, 2017  (KR) .......................... 10-2017-0038487

(51) Int. Cl.
*H01L 33/50*    (2010.01)
*H01L 27/15*    (2006.01)
(Continued)

(52) U.S. Cl.
CPC ........ *H01L 33/504* (2013.01); *H01L 25/0753* (2013.01); *H01L 25/0756* (2013.01);
(Continued)

(58) Field of Classification Search
CPC ... H01L 33/504; H01L 33/505; H01L 33/507; H01L 25/0753; H01L 27/156; G09F 9/33
See application file for complete search history.

(56) References Cited

U.S. PATENT DOCUMENTS 10,305,004 B2 *  5/2019  Yoo ........................ H01L 33/504
2007/0069223 A1 *  3/2007  Chen ..................... H01L 27/153
                                                              257/88
(Continued)

FOREIGN PATENT DOCUMENTS

JP    2002-353519 A    12/2002
JP    2009-181955 A     8/2009
(Continued)

*Primary Examiner* — Galina G Yushina
(74) *Attorney, Agent, or Firm* — Mei & Mark LLP (57) ABSTRACT

An LED display apparatus according to one exemplary embodiment is disclosed. The LED display apparatus may include: a first LED substrate in which a plurality of LED elements capable of emitting a first-wavelength light are arranged in rows and columns; a second LED substrate in which a plurality of LED elements capable of emitting a second-wavelength light are arranged, the second LED substrate being provided on the first LED substrate and having a first light transmitting portion formed by punching a partial region of the second LED substrate; and a third LED substrate which is provided on the second LED substrate and in which a plurality of LED elements capable of emitting a third-wavelength light are arranged, the third LED substrate being provided on the second LED substrate and having a second light transmitting portion formed by punching a partial region of the third LED substrate.

4 Claims, 5 Drawing Sheets

(51) Int. Cl.
*H01L 25/075* (2006.01)
*G09F 9/33* (2006.01)
(52) U.S. Cl.
CPC .......... H01L 27/156 (2013.01); H01L 33/505 (2013.01); *G09F 9/33* (2013.01); *H01L 33/507* (2013.01)

(56) References Cited

U.S. PATENT DOCUMENTS

| | | | |
|---|---|---|---|
| 2008/0116470 A1* | 5/2008 | Nishimura | H01L 25/0756 257/89 |
| 2009/0267794 A1* | 10/2009 | Chang | G09F 9/33 340/907 |
| 2011/0176116 A1* | 7/2011 | Grotsch | G03B 21/2033 353/31 |
| 2014/0168576 A1 | 6/2014 | Lee | |
| 2015/0207043 A1 | 7/2015 | Pfeuffer et al. | |

FOREIGN PATENT DOCUMENTS

| | | |
|---|---|---|
| JP | 2011-198946 A | 10/2011 |
| JP | 2012-174939 A | 9/2012 |
| JP | 2015-528213 A | 9/2015 |
| WO | 2013/015037 A1 | 10/2011 |

\* cited by examiner

LED DISPLAY DEVICE

CROSS-REFERENCE TO RELATED APPLICATIONS

This application is a National Phase Entry Application of PCT Application No. PCT/KR2018/000230 filed on 5 Jan. 2018, which claims priority to Korean Patent Application No. 10-2017-0038487 filed on 27 Mar. 2017 in Korean Intellectual Property Office, the entire contents of which is hereby incorporated by reference in its entirety.

BACKGROUND OF THE INVENTION

1. Field of the Invention

The present invention relates to a display field. More specifically, the present invention relates to a display using a light emitting diode (LED) as a light source.

2. Description of the Related Art

A light emitting diode (LED) is a type of a semiconductor device which constitutes a light source by forming a PN diode of a compound semiconductor and can implement light of various colors. Such a light emitting device has a long lifespan, can be reduced in size and weight, and can be driven at a low voltage. In addition, the LED is resistant to impact and vibration, does not require a preheating time and complicated driving, and can be packaged after being mounted on a substrate or a lead frame in various forms. Thus, the LED can be modularized for various purposes and applied to a backlight unit or various lighting apparatuses.

Meanwhile, with the development of future smart devices such as wearable devices, interest in microdisplays is increasing. The microdisplay can be used in all optical applications that are manufactured in an LED chip size of 10 to 100 μm and need to be reduced in power, size, and weight, for example, a flexible display, a smart fiber, a biocontact lens, head mounted display (HMD), human body attachment, and wireless communication fields.

In particular, microdisplay has emerged as an alternative to light and clear virtual reality (VR) devices, which have become an issue in recent years, and is also expected to be suitable for TV displays because the microdisplay can be made larger.

However, there has not been proposed a microdisplay that can be easily manufactured and can simultaneously support full colors (RGB).

BRIEF SUMMARY OF THE INVENTION

An aspect of the present invention provides an LED display apparatus capable of supporting various colors, such as full colors or white light, according to a user's selection.

Another aspect of the present invention provides an LED display apparatus that can be manufactured through a simple and quick process.

According to one embodiment, an LED display apparatus includes: an LED substrate in which a plurality of LED elements emitting first-wavelength light are arranged in rows and columns; a first wavelength conversion sheet provided on the LED substrate and converting the first-wavelength light into second-wavelength light; and a second wavelength conversion sheet provided on the first wavelength conversion sheet and converting the first-wavelength light or the second-wavelength light into third-wavelength light.

A light transmitting portion that transmits the first-wavelength light may be formed in at least a partial region of the first wavelength conversion sheet, and a light transmitting portion that transmits the first-wavelength light or the second-wavelength light may be formed in at least a partial region of the second wavelength conversion sheet.

Each of the plurality of LED elements may correspond to a subpixel.

The light transmitting portions of the first wavelength conversion sheet and the second wavelength conversion sheet may be formed in at least some of regions corresponding to positions of the subpixels.

The light transmitting portions of the first wavelength conversion sheet and the second wavelength conversion sheet may be formed at positions at which the first-wavelength light, the second-wavelength light, and the third-wavelength light are emitted.

The light transmitting portions may be formed in both the first wavelength conversion sheet and the second wavelength conversion sheet in a region corresponding to a first subpixel constituting one pixel, the light transmitting portion may be formed only in the second wavelength conversion sheet in a region corresponding to a second subpixel constituting the one pixel, and the light transmitting portion may be formed only in the first wavelength conversion sheet in a region corresponding to a third subpixel constituting the one pixel.

Light emitted by the LED display apparatus may be fourth-wavelength light in which the first-wavelength light, the second-wavelength light, and the third-wavelength light are mixed.

The fourth-wavelength light may be white light.

The LED substrate may be manufactured by growing an LED semiconductor emitting the first-wavelength light on a substrate.

The LED substrate, the first wavelength conversion sheet, and the second wavelength conversion sheet may have the same area.

Each of the light transmitting portion formed in the first wavelength conversion sheet and the light transmitting portion formed in the second wavelength conversion sheet may have the same area as the area of a corresponding one of the plurality of LED elements arranged in the LED substrate.

According to another embodiment, an LED display apparatus includes: a first LED substrate in which a plurality of LED elements emitting first-wavelength light are arranged; a second LED substrate which is provided on the first LED substrate and in which a plurality of LED elements emitting second-wavelength light are arranged; and a third LED substrate which is provided on the second LED substrate and in which a plurality of LED elements emitting third-wavelength light are arranged, wherein a light transmitting portion that transmits the first-wavelength light is formed in at least a partial region of the second LED substrate, and a light transmitting portion that transmits the first-wavelength light or the second-wavelength light is formed in at least a partial region of the third LED substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention can be variously modified and embodied. The present invention will be described in detail with reference to specific embodiments. This is not intended to limit the invention to the specific embodiments, but it will be understood that the present invention includes all modifications, equivalents, and alternatives falling within the spirit and scope of the invention.

Furthermore, in the following descriptions and the accompanying drawings, descriptions of well-known functions and constructions will be omitted if they are considered to unnecessarily obscure the gist of the present invention. In addition, it will be understood that although the terms "first", "second", etc. may be used herein to describe various components, these components should not be limited by these terms. These components are only used to distinguish one component from another.

It will be understood that when a component is referred to as being "connected to" or "coupled to" another component, it may be directly connected or coupled to the other component or intervening components may be present.

In the present specification, a component represented by "unit", "module", or the like refers to a case where two or more components are combined into one component, or one component is divided into two or more components. In addition, each of the components to be described below may additionally perform some or all of the functions that are handled by other components in addition to the main function in charge of itself, and some of the main functions that each of the components is responsible for may be performed by other components.

Hereinafter, specific embodiments of the present invention will be described with reference to the accompanying drawings.

Figure 1:
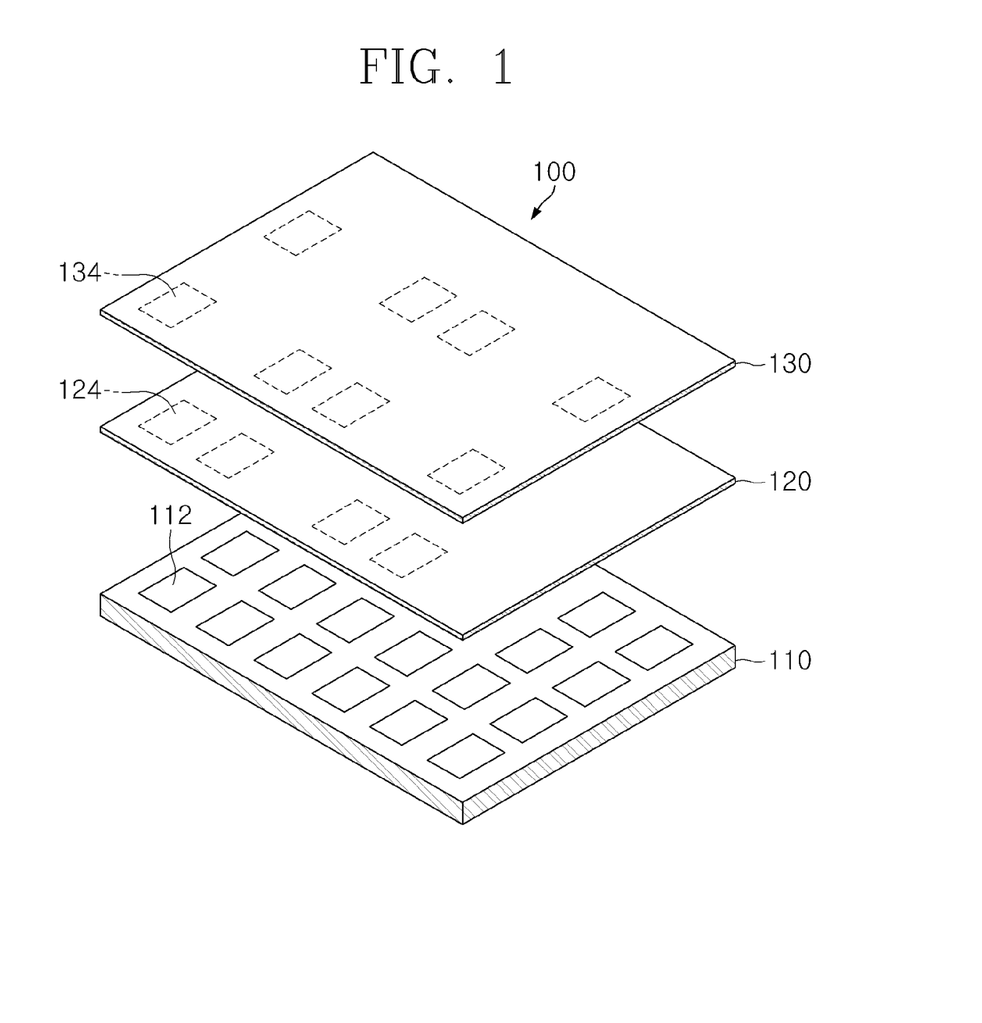
FIG. 1 is a view of an LED display apparatus according to an embodiment of the present invention.

FIG. 1 is a view of an LED display apparatus 100 according to an embodiment of the present invention.

Referring to FIG. 1, the LED display apparatus 100 according to the embodiment of the present invention may include an LED substrate 110, a first wavelength conversion sheet 120, and a second wavelength conversion sheet 130.

A plurality of LED elements 112 that emit first-wavelength light are arranged on the LED substrate 110 in rows and columns. The first-wavelength light may include, for example, blue light, but the present invention is not limited thereto. When the first-wavelength light is blue light, the first wavelength may be in a range of about 400 nm to about 499 nm. Each of the plurality of LED elements 112 may correspond to a subpixel.

In one embodiment, the LED substrate 110 may be manufactured by growing an LED semiconductor emitting the first-wavelength light on a substrate. The substrate may include a sapphire wafer, a SiC wafer, a GaN wafer, and a ZnO wafer, but the present invention is not limited thereto. In addition, the LED semiconductor emitting the first-wavelength light may be formed by epitaxially growing a nitride semiconductor, such as InN, AlN, InGaN, AlGaN, or InGaAlN, on the substrate by a vapor growth method such as a MOCVD method. In addition, the LED semiconductor may be formed by using a semiconductor such as ZnO, ZnS, ZnSe, SiC, GaP, GaAlAs, or AlInGaP, in addition to the nitride semiconductor. The LED semiconductor may include a laminate including an n-type semiconductor layer, an emission layer, and a p-type semiconductor layer, which are formed in this stated order. The emission layer (active layer) may use a stacked semiconductor including a multiple quantum well structure or a single quantum well structure, or a stacked semiconductor having a double heterostructure.

An epi wafer means a substrate on which an LED semiconductor is grown. The LED substrate 110 may be obtained by cutting the epi wafer to a predetermined size.

Since the LED semiconductors grown on the LED substrate 110 are grown by the vapor growth method such as the MOCVD method, the LED semiconductors are homogeneous. Therefore, the LED substrate 110 may emit single light, that is, only first-wavelength light.

As a method of manufacturing a microdisplay, there is a method of transferring an LED semiconductor onto a substrate. However, since such a method has to individually transfer LED semiconductors onto a substrate, the manufacturing process is complicated and the yield of product is low. In one embodiment, since the LED substrate itself obtained from the epi wafer is used, an LED display apparatus or a microdisplay may be simply manufactured.

Referring again to FIG. 1, the first wavelength conversion sheet 120 that converts first-wavelength light into second-wavelength light is provided on the LED substrate 110, and the second wavelength conversion sheet 130 that converts the first-wavelength light or the second-wavelength light into third-wavelength light is provided on the first wavelength conversion sheet 120. The second-wavelength light may include red light, and the third-wavelength light may include green light, but the present invention is not limited thereto. When the second-wavelength light is red light, the second wavelength may be in a range of about 570 nm to 699 nm. When the third-wavelength light is green light, the third wavelength may be in a range of about 500 nm to about 569 nm.

The first wavelength conversion sheet 120 and the second wavelength conversion sheet 130 may be sheets in which a phosphor is dispersed in a light-transmitting resin. Examples of the phosphor may include a silicate-based phosphor, a silicon oxynitride-based phosphor, a sulfide-based phosphor, a SiAlON-based phosphor, and an oxide-based phosphor. These materials may be used solely or in combination. The first wavelength conversion sheet 120 and the second wavelength conversion sheet 130 may be manufactured in a sheet type and arranged on a resin, or may be formed by directly coating a phosphor on a resin.

In one embodiment, the first wavelength conversion sheet 120 and the second wavelength conversion sheet 130 may have a structure in which quantum dots are dispersed in a matrix. The quantum dots are a compound that emits light having a specific wavelength. Known quantum dots that emit light having a specific wavelength may be used without limitation. For example, the quantum dot may include a core particle and a ligand bonded to the surface of the core particle.

The first wavelength conversion sheet 120 and the second wavelength conversion sheet 130 absorb light emitted from a lower portion and emit wavelength-converted light to the outside.

Referring to FIG. 1, a first light transmitting portion 124 that transmits light may be formed in a partial region of the first wavelength conversion sheet 120, and a second light transmitting portion 134 that transmits light may be formed in a partial region of the second wavelength conversion sheet 130. The first light transmitting portion 124 and the second light transmitting portion 134 may be formed by punching the first wavelength conversion sheet 120 and the second wavelength conversion sheet 130.

In one embodiment, "a wavelength conversion material" (for example, phosphor or quantum dots) that converts the first-wavelength light into the second-wavelength light and "b wavelength conversion material" (for example, phosphor or quantum dots) that converts the first-wavelength light or the second-wavelength light into the third-wavelength light may be arranged on one wavelength conversion sheet. In this case, it is very difficult to manufacture the corresponding wavelength conversion sheet.

That is, the a wavelength conversion material is arranged in a region requiring the function of converting the first-wavelength light into the second-wavelength light in one wavelength conversion sheet, and the b wavelength conversion material is arranged in another region. In the case of the microdisplay, since the size of the material is very fine, it is very difficult to manufacture one wavelength conversion sheet.

Therefore, in one embodiment, the first wavelength conversion sheet 120 that converts the first-wavelength light into the second-wavelength light and the second wavelength conversion sheet 130 that converts the first-wavelength light or the second-wavelength light into the third-wavelength light are separately manufactured. In this manner, the manufacturing process is simplified. The light transmitting portion is formed in a necessary region of each of the first and second wavelength conversion sheets 120 and 130. Therefore, the same effect as that when one wavelength conversion sheet is formed can be achieved.

After a user selects a color that can be supported by the LED display apparatus 100, the light transmitting portions 124 and 134 may be formed in the first wavelength conversion sheet 120 and the second wavelength conversion sheet 130. For example, when the user intends to manufacture the LED display apparatus 100 that emits only the first-wavelength light, only the first-wavelength light may be emitted to the outside by forming the light transmitting portions 124 and 134 (that is, so as not to cause light wavelength conversion) at all positions corresponding to the positions of the plurality of LED elements 112 in the first wavelength conversion sheet 120 and the second wavelength conversion sheet 130.

Meanwhile, in the LED display apparatus 100 according to the embodiment of the present invention, the areas of the LED substrate 110, the first wavelength conversion sheet 120, and the second wavelength conversion sheet 130 (for example, when the LED substrate, the first wavelength conversion sheet, and the second wavelength conversion sheet have a rectangular shape, the corresponding area is the product of a horizontal length and a vertical length) may be the same as each other, and the areas of the LED element 112 arranged on the LED substrate 110 and the light transmitting portions 124 and 134 formed in the first wavelength conversion sheet 120 and the second wavelength conversion sheet 130 (for example, when the LED element and the light transmitting portions have a rectangular shape, the corresponding area is the product of a horizontal length and a vertical length) may be the same as each other.

The LED display apparatus 100 according to the embodiment of the present invention can support full colors, and details thereof will be described with reference to FIG. 2.

Figure 2:
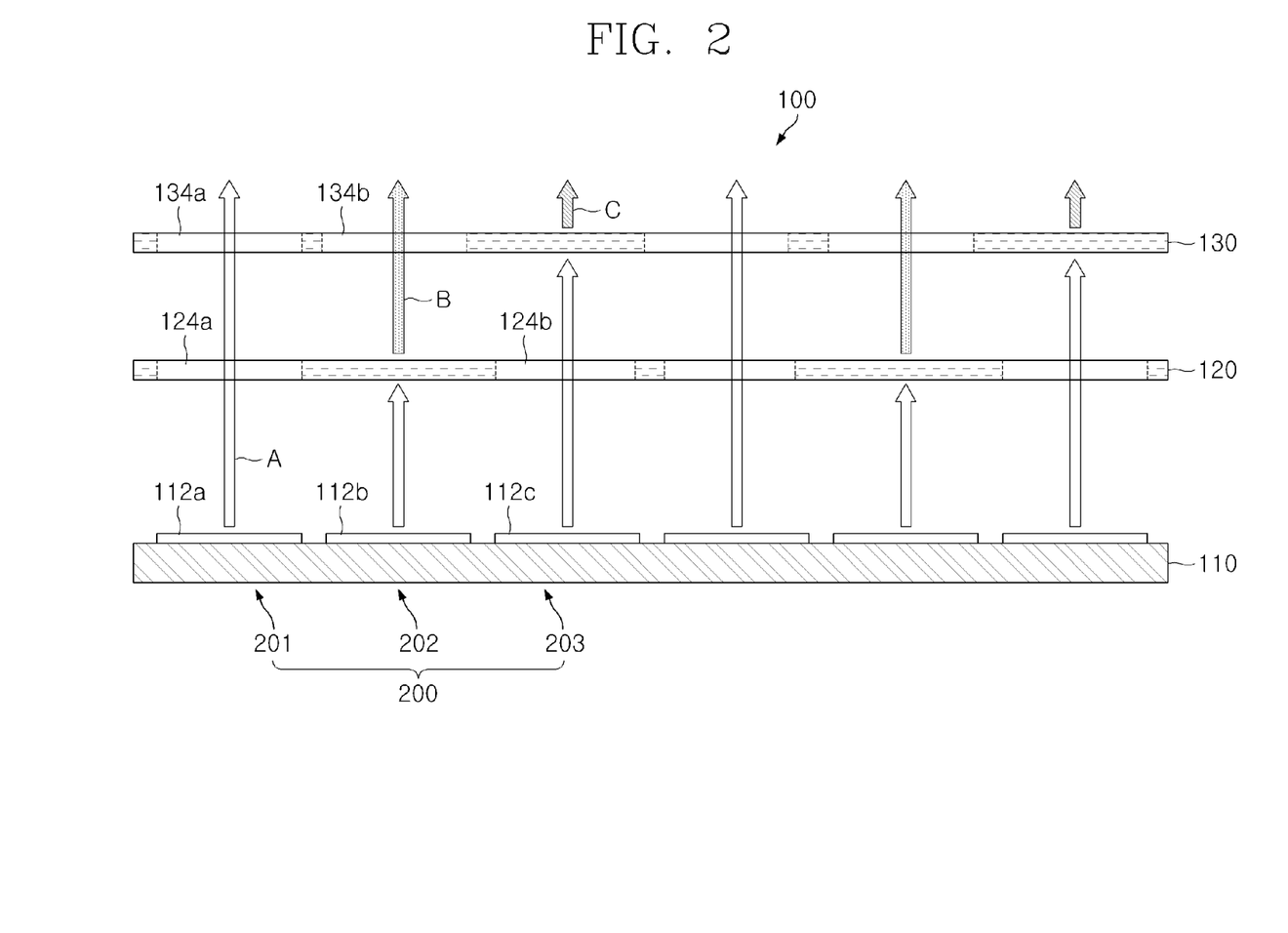
FIG. 2 is a side view of the LED display apparatus according to the embodiment of the present invention.

FIG. 2 is a side view of the LED display apparatus 100 according to the embodiment of the present invention.

The LED display apparatus 100 that supports the full colors is illustrated in FIG. 2. First light transmitting portions 124a and 124b and second light transmitting portions 134a and 134b may be formed in at least some of positions corresponding to subpixels 201, 202, and 203 in the first wavelength conversion sheet 120 and the second wavelength conversion sheet 130, so that the LED display apparatus 100 emit all the first-wavelength light A, the second-wavelength light B, and the third-wavelength light C.

In FIG. 2, LED elements 112a, 112b, and 112c may correspond to the subpixels 201, 202, and 203, and the three subpixels 201, 202, and 203 may correspond to one pixel 200. In the first wavelength conversion sheet 120 and the second wavelength conversion sheet 130, the first light transmitting portion 124a and the second light transmitting portion 134a are formed at a position corresponding to the first subpixel 201. Consequently, the first-wavelength light A emitted from the LED element 112a corresponding to the first subpixel 201 may be emitted to the outside.

In addition, in the second wavelength conversion sheet 130, the second light transmitting portion 134b is formed at a position corresponding to the second subpixel 202. The first-wavelength light A emitted from the LED element 112b corresponding to the second subpixel 202 may be converted into the second-wavelength light B by the first wavelength conversion sheet 120, and the second-wavelength light B may be emitted to the outside.

In addition, in the first wavelength conversion sheet 120, the first light transmitting portion 124b is formed at a position corresponding to the third subpixel 203. The first-wavelength light A emitted from the LED element 112c corresponding to the third subpixel 203 may be converted into the third-wavelength light C by the second wavelength conversion sheet 130, and the third-wavelength light C may be emitted to the outside. In one embodiment, the first light transmitting portion 124b corresponding to the third subpixel 203 may be omitted from the first wavelength conversion sheet 120. In this case, the second wavelength conversion sheet 130 may convert the second-wavelength light B emitted by the first wavelength conversion sheet 120 into the third-wavelength light C.

Consequently, the LED display apparatus 100 can emit all the first-wavelength light A, the second-wavelength light B, and the third-wavelength light C with respect to one pixel 200, thereby supporting the full colors.

Figure 3:
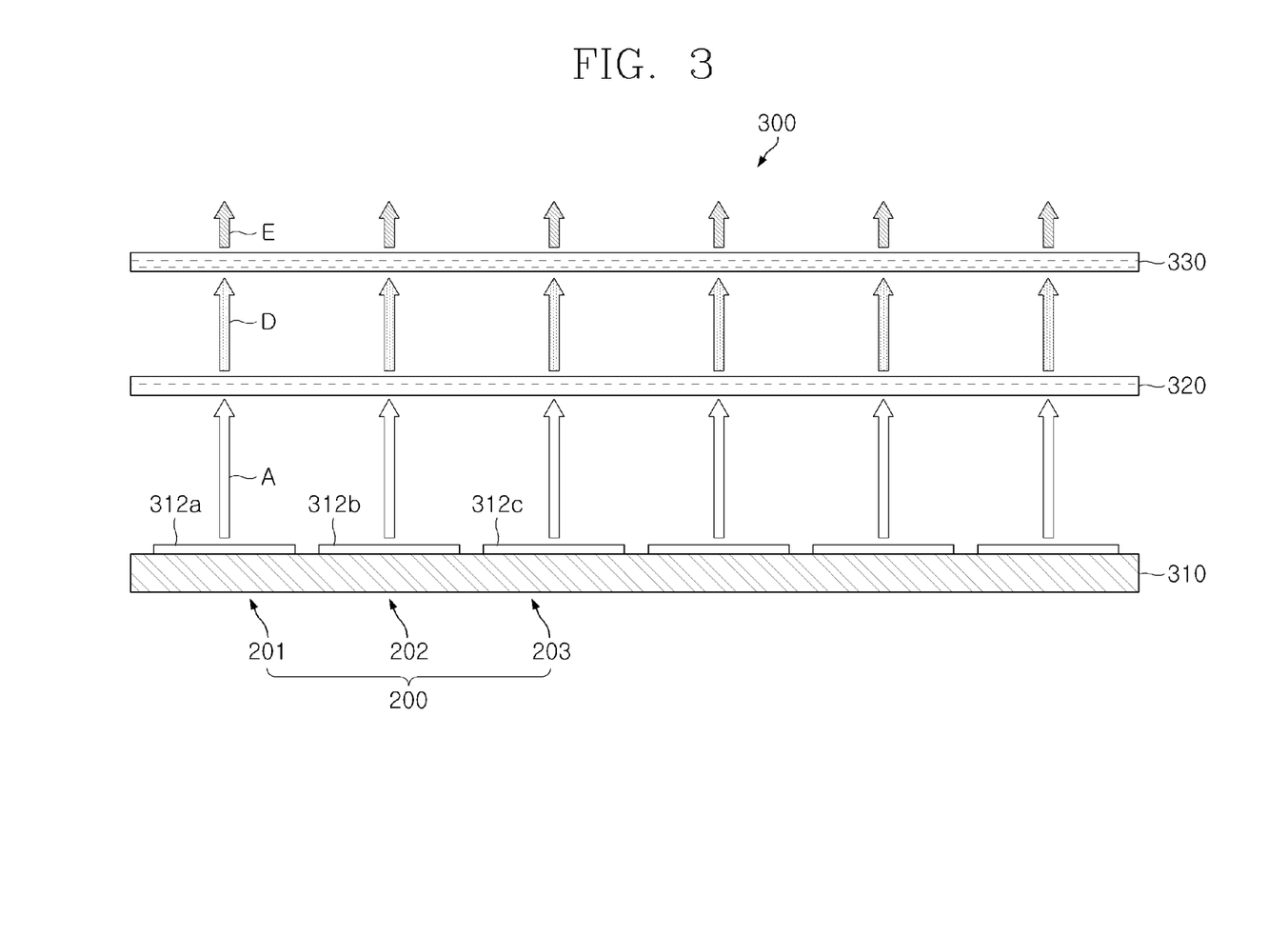
FIG. 3 is a side view of an LED display apparatus according to another embodiment of the present invention.

FIG. 3 is a side view of an LED display apparatus 300 according to another embodiment of the present invention. The LED display apparatus 300 illustrated in FIG. 3 supports fourth-wavelength light E, that is, white light.

Among materials constituting the wavelength conversion sheet, there is a material that converts a wavelength of all (or most) of absorbed light. However, some materials convert only a wavelength of some light among absorbed lights and transmit the other light as it is. In the embodiment illustrated in FIG. 3, a first wavelength conversion sheet 320 and a second wavelength conversion sheet 330 including a material having a wavelength conversion efficiency of about 50% may be used.

In addition, according to one embodiment, in manufacturing the first wavelength conversion sheet 320 and the second wavelength conversion sheet 330, the wavelength conversion efficiency may be artificially reduced by coating phosphors or arranging quantum dots only in some regions instead of the entire regions.

That is, as illustrated in FIG. 3, when the first wavelength conversion sheet 320 and the second wavelength conversion sheet 330 perform wavelength conversion on some of absorbed light, the light transmitting portions are not formed in the first wavelength conversion sheet 320 and the second wavelength conversion sheet 330, and consequently, the fourth-wavelength light E may be emitted to the outside.

In other words, some of the first-wavelength light A emitted from the LED elements 312a, 312b, and 312c is converted into the second-wavelength light B by the first wavelength conversion sheet 320. Consequently, light D having a new wavelength is emitted. Some of the light D having the new wavelength emitted from the first wavelength conversion sheet 320 is converted into the fourth-wavelength light D by the second wavelength conversion sheet 330. Consequently, the light emitted from the LED display apparatus 300 may include the fourth-wavelength light E, in which all the first-wavelength light, the second-wavelength light, and the third-wavelength light are mixed, for example, white light.

In one or more embodiments of the present invention, a user may select the first wavelength conversion sheets 120 and 320 and the second wavelength conversion sheets 130 and 330 having specific wavelength conversion efficiency according to a user's purpose, and the light transmitting portions 124 and 134 are formed at predetermined positions of the first wavelength conversion sheet 120 and 320 and the second wavelength conversion sheets 130 and 330. In this manner, the LED display apparatus supporting various colors may be manufactured.

Figure 4:
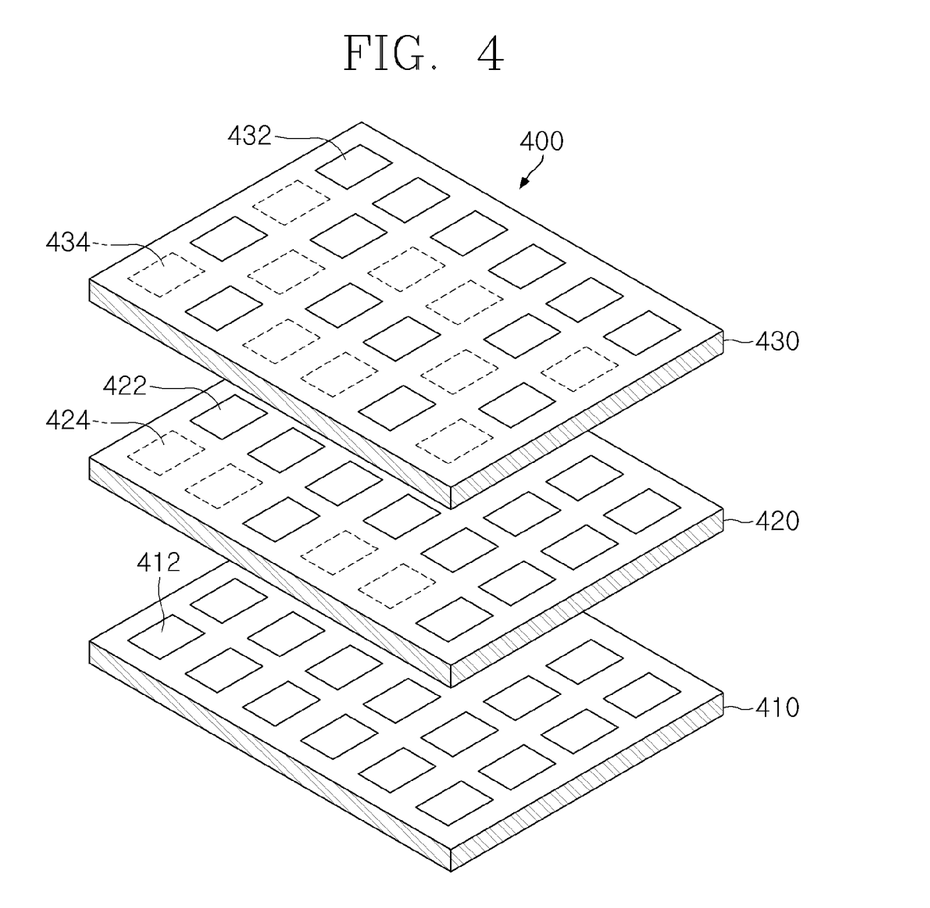
FIG. 4 is a view of an LED display apparatus according to another embodiment of the present invention.

FIG. 4 is a view of an LED display apparatus 400 according to another embodiment of the present invention.

Referring to FIG. 4, the LED display apparatus 400 according to another embodiment of the present invention may include a first LED substrate 410 in which a plurality of first LED elements 412 emitting first-wavelength light are arranged, a second LED substrate 420 which is provided on the first LED substrate 410 and in which a plurality of second LED elements 422 emitting second-wavelength light are arranged, and a third LED substrate 430 which is provided on the second LED substrate 420 and in which a plurality of third LED elements 432 emitting third-wavelength light are arranged.

A first light transmitting portion 424 and a second light transmitting portion 434 are formed in the second LED substrate 420 and the third LED substrate 430, respectively. The first light transmitting portion 424 is capable of transmitting the first-wavelength light emitted from the first LED element 412, and the second light transmitting portion 434 is capable of transmitting the first-wavelength light emitted from the first LED element 412 or the second-wavelength light emitted from the second LED element 422. The first light transmitting portion 424 and the second light transmitting portion 434 may be formed by punching the second LED substrate 420 and the third LED substrate 430. Each of the first light transmitting portion 424 formed in the second LED substrate 420 and the second light transmitting portion 434 formed in the third LED substrate 430 may have the same area as the area of a corresponding one of the plurality of LED elements 412 arranged in the first LED substrate 410.

As described above, the first LED substrate 410, the second LED substrate 420, and the third LED substrate 430 may be obtained from epi wafers in which LED semiconductors are grown.

The LED display apparatus 400 illustrated in FIG. 4 can support the full colors, and details thereof will be described with reference to FIG. 5.

Figure 5:
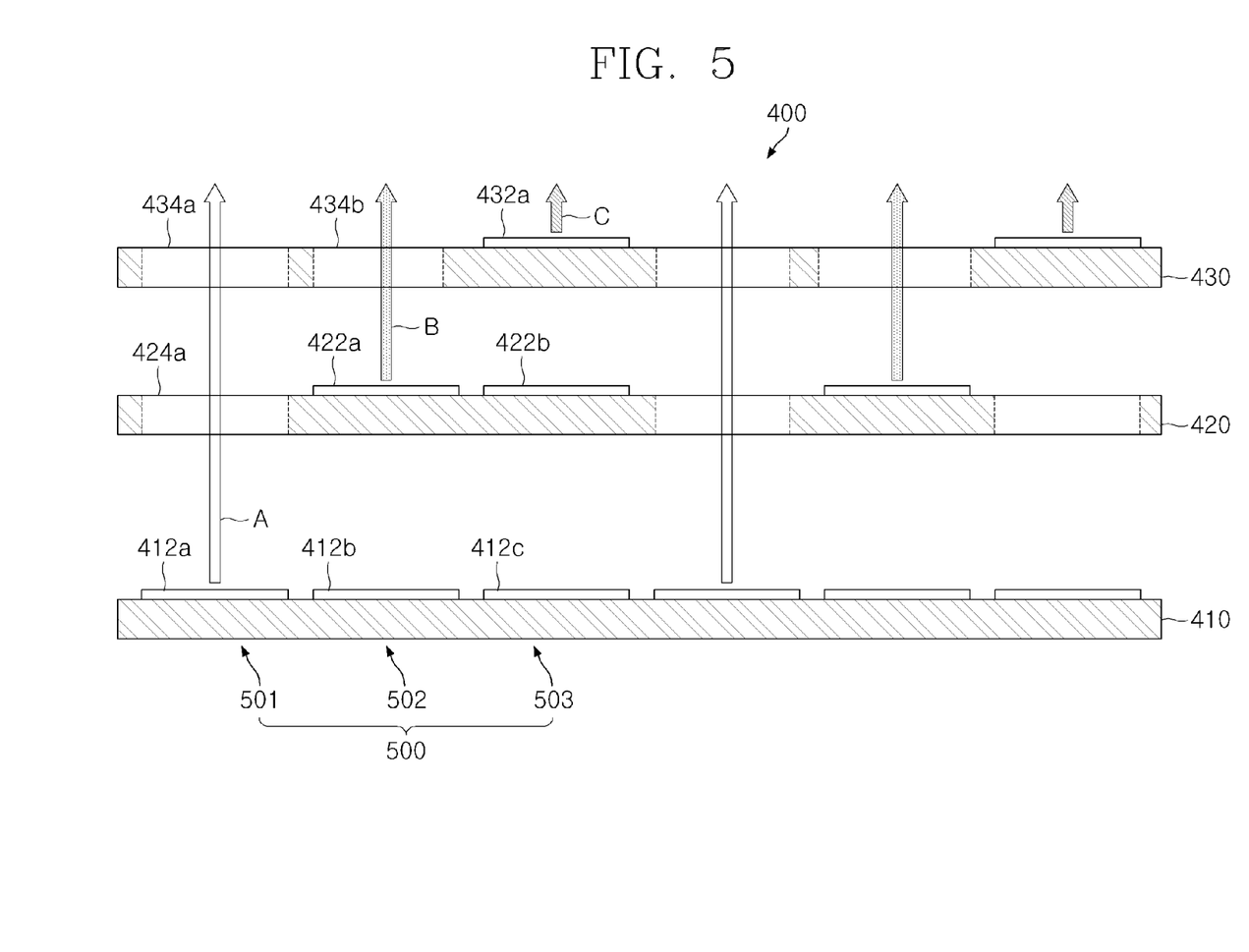
FIG. 5 is a side view of the LED display apparatus according to another embodiment of the present invention.

FIG. 5 is a side view of the LED display apparatus 400 according to another embodiment of the present invention.

Light transmitting portions 424a, 434a, and 434b may be formed in at least some of positions corresponding to subpixels 501, 502, and 503 in the second LED substrate 420 and the third LED substrate 430, so that the LED display apparatus 400 emit all the first-wavelength light A, the second-wavelength light B, and the third-wavelength light C in one pixel 500.

The first light transmitting portion 424a and the second light transmitting portion 434a are formed corresponding to the first subpixel 501 in the second LED substrate 420 and the third LED substrate 430. Thus, the first-wavelength light A emitted from the first LED element 412a may be emitted to the outside.

In addition, the second light transmitting portion 434b is formed corresponding to the second subpixel 502 in the third LED substrate 430. Thus, the second-wavelength light B emitted from the second LED element 422a of the second LED substrate 420 may be emitted to the outside.

In addition, no light transmitting portion is formed corresponding to the third subpixel 503 in the second LED substrate 420 and the third LED substrate 430. Thus, the third-wavelength light C emitted from the third LED element 432a of the second LED substrate 420 may be emitted to the outside.

In one embodiment, even when the first LED element 412b of the first LED substrate 410 corresponding to the second subpixel 502, the first LED element 412c of the first LED substrate 410 corresponding to the third subpixel 503, and the second LED element 422b of the second LED substrate 420 emit light, the light is blocked by the substrate arranged on the upper side. Thus, the light transmitting portions may be formed by not arranging the corresponding LED elements 412b, 412c, and 422b in the LED substrates 410 and 420 or by the punching processing even when arranged.

Meanwhile, the LED display apparatuses 100, 300, and 400 described above may be manufactured as microdisplays.

The LED display apparatus according to the embodiment of the present invention can emit various colors, such as full colors or white light, according to a user's selection.

The LED display apparatus according to the embodiment of the present invention can be manufactured in a simple and quick manner.

However, the effects that the LED display apparatus according to the embodiment of the present invention can achieve are not limited to those described above, and it can be understood by those of ordinary skill in the art that other effects not mentioned can be obtained from the following description.

Although preferred embodiments of the present invention have been described for illustrative purposes, those skilled in the art will appreciate that various modifications, additions and substitutions are possible, without departing from the scope and spirit of the invention as disclosed in the accompanying claims. Therefore, the embodiments of the present invention are disclosed only for illustrative purposes and should not be construed as limiting the present invention.

What is claimed is:

1. An LED display apparatus comprising:
a first LED substrate in which a plurality of LED elements capable of emitting a first-wavelength light are arranged in rows and columns;
a second LED substrate in which a plurality of LED elements capable of emitting a second-wavelength light are arranged, the second LED substrate being provided on the first LED substrate and having a first light transmitting portion formed by punching a partial region of the second LED substrate; and
a third LED substrate which is provided on the second LED substrate and in which a plurality of LED elements capable of emitting a third-wavelength light are arranged, the third LED substrate being provided on the second LED substrate and having a second light transmitting portion formed by punching a partial region of the third LED substrate,
wherein the plurality of LED elements of the first LED substrate are capable of emitting the first-wavelength light through the first and second light transmitting portions,
wherein the plurality of LED elements of the second LED substrate are capable of emitting the second-wavelength light through the second light transmitting portion, and
wherein light which the LED display apparatus is intended to emit is a fourth wavelength light in which the first-wavelength light, the second-wavelength light and the third-wavelength light are mixed.

2. The LED display apparatus of claim 1, wherein the first LED substrate, the second LED substrate and the third LED substrate have the same area.

3. The LED display apparatus of claim 1, wherein each of the first light transmitting portion formed in the second LED substrate and the second light transmitting portion formed in the third LED substrate has the same area as the area of a corresponding one of the plurality of LED elements arranged in the first LED substrate.

4. The LED display apparatus of claim 1, wherein the fourth-wavelength light is white light.

* * * * *